(12) United States Patent
Tabrizi et al.

(10) Patent No.: US 8,277,165 B2
(45) Date of Patent: Oct. 2, 2012

(54) TRANSFER MECHANISM WITH MULTIPLE WAFER HANDLING CAPABILITY

(75) Inventors: Farzad Tabrizi, Reno, NV (US); David Barker, Walnut Creek, CA (US)

(73) Assignee: Dynamic Micro System Semiconductor Equipment GmbH, Radofzell (DE)

( * ) Notice: Subject to any disclaimer, the term of this patent is extended or adjusted under 35 U.S.C. 154(b) by 641 days.

(21) Appl. No.: 11/859,755

(22) Filed: Sep. 22, 2007

(65) Prior Publication Data

US 2009/0081007 A1    Mar. 26, 2009

(51) Int. Cl.
*B25J 15/00*    (2006.01)

(52) U.S. Cl. ............... 414/806; 414/744.5; 294/87.1; 901/30

(58) Field of Classification Search ............... 414/744.5, 414/744.3, 806; 294/87.1; 901/30
See application file for complete search history.

(56) References Cited

U.S. PATENT DOCUMENTS

| 5,908,281 A * | 6/1999 | Kiley ..................... 414/744.5 |
| 6,485,250 B2 * | 11/2002 | Hofmeister .............. 414/744.1 |

\* cited by examiner

*Primary Examiner* — Donald Underwood
(74) *Attorney, Agent, or Firm* — Tue Nguyen

(57) ABSTRACT

An integrated robotic mechanism is disclosed for improving transport equipment, integrating an object movement with other functionalities such as alignment or identification. The disclosed integrated robot assembly can comprise a multiple end effector for moving a plurality of workpieces, a single end effector for moving a single workpiece, a rotation chuck incorporated on the robot body to provide alignment capability, and an optional identification subsystem for identify the object during transport. The present invention robot assembly can be used in a sorter or stocker equipment, in processing equipment, and a transfer system.

18 Claims, 15 Drawing Sheets

TRANSFER MECHANISM WITH MULTIPLE WAFER HANDLING CAPABILITY

BACKGROUND

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport workpieces, typically stored in carrier boxes, from one location to another location, from one equipment to another equipment. In a process system, a robot is typically used to remove the workpieces from the carrier boxes, and then loaded into a loadlock. Another robot can be used to move the workpiece from the loadlock into a processing chamber, and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any workpiece processing system.

Another type of equipment is supplemental equipment such as a stocker, designed for storing the workpieces until needed, or a sorter, designed for sorting the workpieces into certain desirable order. In a typical bare stocker system, a robot is typically used to remove the workpieces from the carrier boxes, and then loaded into a loadlock. Another robot can be used to move the workpiece from the loadlock into a storage chamber, where the workpieces are stored without the original carrier boxes. For box stocker system, the workpieces are stored together with the carrier boxes, without the need for removing them out of the carrier boxes.

Robot handling can be considered overhead operation, since the purpose of robot handling is to transport the workpieces between locations. Thus to improve the efficiency of the fabrication facility and to improve the throughput of the equipment, faster movement of robots, and multiple robot assemblies can be used. Thus some equipment provides a robot assembly with multiple carrier arms, to allow the transfer of multiple workpieces. The multiple carrier arms are typically not independent, and thus maximum efficiency cannot be realized. Another robot configuration includes multiple independent robot arms which can move independently, and thus can essentially double the throughput with one robot.

With advancements in fabrication processes comes the demand for higher throughput, smaller footprint and better functionality. Integrated robot assembly, combining the transfer mechanism with other functions such as object identification and object alignment, can greatly improve this need.

SUMMARY

The present invention discloses methods and apparatuses for workpiece transfer, configured to transfer a plurality of workpieces or multiple workpieces. In an exemplary embodiment, the present workpiece transfer mechanism comprises a robot arm having a multiple end effector for transferring a plurality of workpieces or multiple workpieces and a single end effector for transferring a single workpiece. In an aspect, the single end effector can be configured to handle the workpieces within the multiple end effector. The multiple end effector can be configured to handle the workpieces from the side edges, and the single end effector can be configured to handle the workpiece from the top or bottom. This configuration provides the handling of the workpieces between the end effectors in one dimensional movement, with the end effectors moving up or down relative to each other.

The multiple end effector can transfer a plurality of workpieces or multiple workpieces at the same time from or to a process chamber. The single end effector can transfer a single workpiece, either from/to a process chamber or from/to the multiple end effector. For example, the present robot arm can transfer a stack of workpiece from a station such as a cassette using the multiple end effector, and re-distribute the workpieces to a plurality of other stations using the single end effector. Alternatively, the present robot arm can retrieve the workpieces from a plurality of process chambers, store in the multiple end effector, and place the whole stack of workpieces to another station. The present robot arm thus can be used for workpiece sorter or workpiece distributor. The simultaneous transferring a whole stack of workpieces may improve the transfer throughput, especially for stations with high overhead such as a cassette loadlock.

In an embodiment, the present robot arm further comprises an aligner or ID reader capabilities. In an aspect, the aligner/reader is disposed within the body of the robot arm, preferably in the vicinity of the single end effector. The aligner can comprise a rotating chuck, located under the single end effector. Thus the transfer of the workpiece from and to the aligner can be handled by the single end effector. The rotating chuck and the single end effector can include relative up/down motion to clear the workpiece from the constraint of the end effector grip. Workpiece centering can be performed through a separate centering mechanism, or through the locating of the workpiece center by the rotating chuck, plus the return to the chuck center by the single end effector. An ID reader, preferably with OCR capability, can be disposed in the vicinity of the aligner for reading ID marks and identifying the workpiece.

DETAILED DESCRIPTION OF THE EMBODIMENTS

Figure 1:
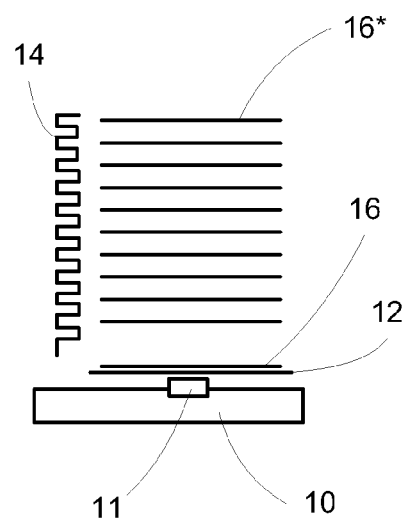
FIG. 1 shows a schematic of an embodiment of the present invention robot arm.

The present invention relates to apparatuses and methods for improving workpiece flowing in a production facility. The improvements can comprise an integration of other functionalities into the object transport movement, thus potentially improving throughput, adding functionalities and reducing footprint. During the processing of semiconductor workpieces in the manufacture of microelectronics, different equipments are employed for several hundred processing steps. The process flow of a workpiece is essential serial, with most of the tools operate on the workpieces one at a time. The present invention provides the handling or movement of workpieces in a manner which assured a continuous flow of workpieces within an equipment and within a fabrication facility.

The present invention thus provides, in an exemplary embodiment, multiple transport mechanisms, such as a plurality of end effectors, to perform the operations of moving workpieces. A station, such as a wafer or reticle stocker station, is centrally served by a pair of robots or workpiece transport mechanisms. Each transport is capable of axial motion along a member and pivotal or articulated motion of an arm. The axial motion is used to move workpieces between the stations and the carrier residing in a load lock, and the articulated arm is used for more constrained motions within the stations, such as swinging between stations.

The present invention discloses apparatuses and methods for improving transport equipment of semiconductor fabrication objects or workpieces, such as semiconductor wafers, reticles, flat panel displays. In one embodiment, the present invention discloses an integrated robot assembly, configured to transfer a plurality of workpieces, simultaneously or in series, and optionally combining the object transfer with other functionalities such as object identification, object alignment or object centering. An exemplary workpiece transfer mechanism comprises a robot arm with a capability of simultaneously transferring a plurality of workpieces together with the capability of transferring a single workpiece. The workpiece transfer apparatus can have the capability of temporary storing a plurality of workpieces plus the capability of simultaneously or singularly transfer the workpieces from the temporary storage. The object identification subsystem can comprise an OCR component for reading the object inscribed marks. This functionality provides the identification and confirmation of object to be processed, without or with minimum throughput reduction. The object alignment subsystem can comprise a rotation chuck for rotating the object to an orientation mark. This functionality provides the in-situ alignment of object to be processed.

In an embodiment, the present invention includes a method for simultaneous movements. The disclosed method can be applied to object transfer, such as a front end module to transfer wafers, or to object sorter, such as wafer sorter or stocker. A movement of the simultaneous movements includes the movement of a robot system from one wafer position to another wafer position. The other movement of the simultaneous movements includes a wafer identification operation, a wafer ID searching operation, a wafer alignment operation, or a wafer centering operation.

In an aspect, the simultaneous movements, occurring simultaneously with the movement of the robot body, comprise object centering, object rotating, object aligning, object ID locating and/or object reading. Object centering can be accomplished by a centering mechanism. Object rotating and object aligning can be performed by rotating the object through the rotation of a rotatable chuck. Object reading can be accomplished with an OCR reader. Object ID locating can be performed with a stationary reader and a rotating object, or with a rotating reader around the object.

In an embodiment, the present invention discloses an integrated robot assembly comprising a robot body, a plurality of end effectors coupled to the robot body, a rotation chuck coupled to the robot body and/or a reader coupled either to the robot body or to the end effector. The robot assembly is preferably disposed in a transfer environment, such as a transfer chamber, a front end module, or a front interface mechanism.

In an aspect, the robot body can support a plurality of end effectors for moving an object in and out of a chamber, such as a process chamber, a loadlock chamber, a FOUP (front end unified pod), or a FOSB (front opening shipping box). The robot body provides the movements needed for stationing the end effector in the right position for receiving or for placing an object. The robot body can comprise an e.g. z-direction motion to address all objects or chambers in a stacked configuration. For receiving chambers disposed in a circular or surrounding configuration, the robot body can comprise theta motion. For receiving chambers disposed in a linear configuration, the robot body can comprise a linear motion such as a traverse track or a linear guide.

The end effector provides extending and retracting motions to bring an object in/out from the transfer environment, and from/to a plurality of process or storage chambers (e.g. FOUP) coupled to the transfer environment. The end effector extending and retracting motions preferably comprise articulate joint arms or linear motions through linear guides, but can be any mechanical motions. The end effector can also provide lifting motion (e.g. z-direction) for lifting objects. The end effector can comprise edge gripping, air cushion, or vacuum suction for holding the object. The end effector can comprises support pads for supporting the object and for preventing slippage. The end effector can comprise vacuum ports for holding the object. The end effector can comprise edge grips for edge contact handling. Further, the end effector can comprise a plurality of gas ports to provide an air cushion, thus the object can float on an air gap without touching any part of the end effector. The end effector can comprise edge pins for prevent slippage of the object.

In an embodiment, the present workpiece transfer apparatus comprises a robot arm having a multiple end effector for transferring a plurality of workpieces and a single end effector for transferring a single workpiece. The multiple end effector can be configured to handle any number of workpieces, for example a cassette load of 25 8" wafers or 13 12" wafers. The multiple end effector can be configured as a temporary and movable storage area, capable of collecting a boat load of workpieces, then transferring all workpieces simultaneously or singularly to a destination.

FIG. 1 illustrates an exemplary workpiece transfer apparatus according to the present invention. The apparatus comprises a robot arm body 10, housing a multiple end effector 14 and a single end effector 12. An optional aligning/reading mechanism 11 can be disposed on the body 10. The multiple end effector 14 can support a plurality of workpieces 16* and the single end effector 12 supports a single workpiece 16.

Figure 2A:
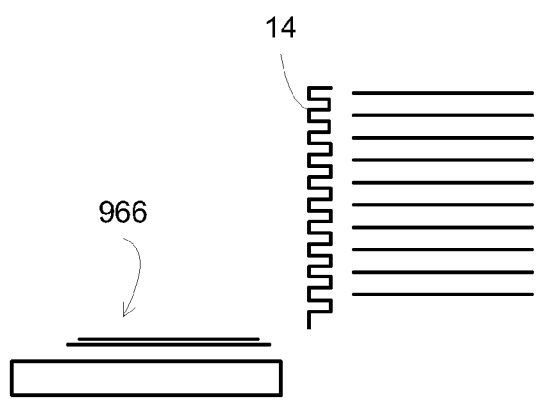
FIG. 2A shows an embodiment with the extending multiple end effector.
Figure 2B:
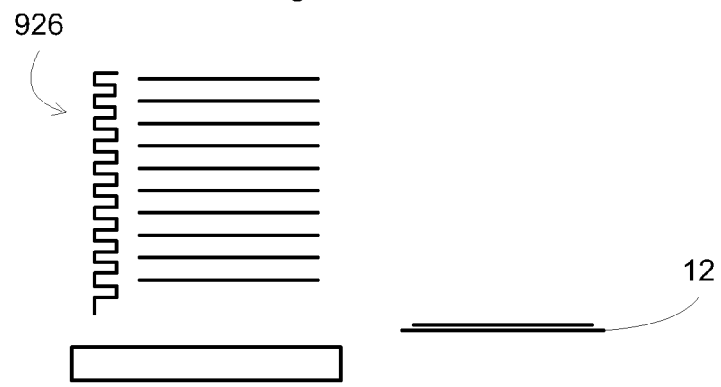
FIG. 2B shows an embodiment with the extending single end effector.

FIG. 2A illustrates an exemplary moving process of the multiple end effector 14. The multiple end effector is shown extending toward a destination station, carrying a plurality of workpieces for simultaneously transfer these workpieces to the destination station. The single end effector is shown in a retract position 966, but can also be extended during the moving process. FIG. 2B illustrates an exemplary moving process of the single end effector 12. The single end effector extends toward a destination station, transferring a single workpiece. In this figure, the multiple end effector is shown in a retract position 926, but can also be extended during the moving process.

In an embodiment, the single end effector can be configured to handle the workpieces within the multiple end effector. The multiple end effector can be configured to handle the workpieces from the side edges, thus allowing the single end effector to receive or place the workpiece from or to the top or bottom of the multiple end effector. This configuration provides the handling of the workpieces between the end effectors in one dimensional movement, with the end effectors moving up or down relative to each other.

Figure 2C:
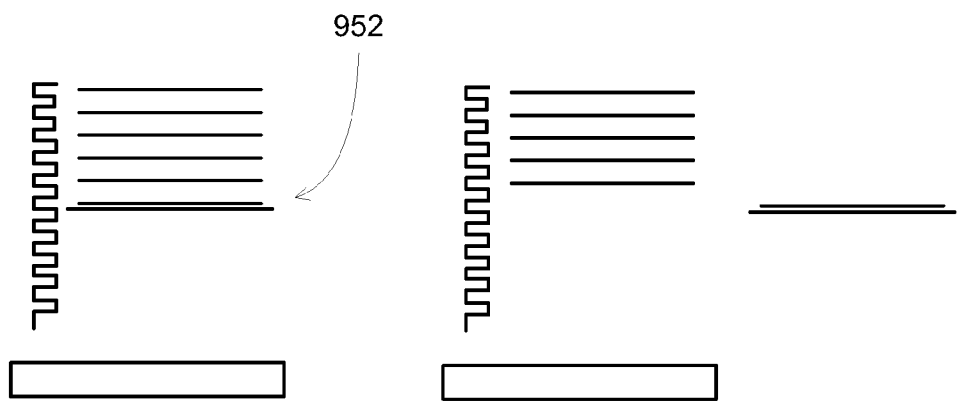
FIG. 2C shows an embodiment with the single end effector taking a workpiece from the multiple end effector.
Figure 2D:
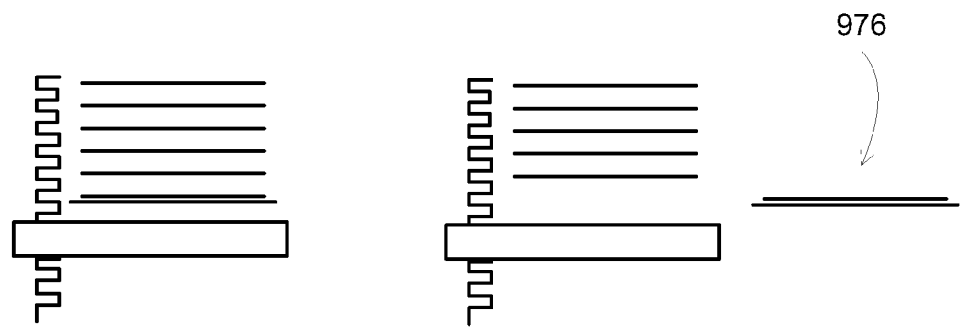
FIG. 2D shows an embodiment with the single end effector extending from the multiple end effector.

FIG. 2C illustrates an exemplary moving process between the multiple end effector and the single end effector. The single end effector can move up until it reaches the bottom workpiece from the multiple end effector. In this configuration, the single end effector can approach the workpieces in the multiple end effector sequentially from the bottom up. Other configurations are possible, for example the single end effector can approach the workpieces randomly, or from top down. The single end effector can extend from the up position 952, to bring the workpiece to a destination station. FIG. 2D illustrate another exemplary moving process between the multiple end effector and the single end effector. The robot body 10 can move down until the single end effector reaches the bottom workpiece from the multiple end effector. The single end effector can extend from this position, to bring the workpiece to a destination station. In general, the single end effector can extend from anywhere with respect to the position of the multiple end effector. The single end effector can also move up and down within the extended position 976.

In an embodiment, the present robot arm further comprises an aligner or ID reader capabilities. In an aspect, the aligner/reader is disposed within the body of the robot arm, preferably in the vicinity of the single end effector. The aligner can comprise a rotating chuck, located under the single end effector. Thus the transfer of the workpiece from and to the aligner can be handled by the single end effector. The rotating chuck and the single end effector can include relative up/down motion to clear the workpiece from the constraint of the end effector grip. Workpiece centering can be performed through a separate centering mechanism, or through the locating of the workpiece center by the rotating chuck, plus the return to the chuck center by the single end effector. An ID reader, preferably with OCR capability, can be disposed in the vicinity of the aligner for reading ID marks and identifying the workpiece.

The present invention also discloses methods to transfer a plurality of workpieces, simultaneously or singularly. The multiple end effector can handle a plurality of workpieces simultaneously. The single end effector can handle a single workpiece at time, either from/to a station or from/to the multiple end effector. For example, the present robot arm can transfer a stack of workpiece from a station such as a cassette using the multiple end effector, and re-distribute the workpieces to a plurality of other stations using the single end effector. Alternatively, the present robot arm can retrieve the workpieces from a plurality of process chambers, store in the multiple end effector, and place the whole stack of workpieces to another station. The multiple end effector can also act as a storage for the workpieces, and preferably a temporary storage during workpiece transit. With these possible configurations, the present robot arm can perform various complex workpiece transfer sequences. The present robot arm thus can be used for workpiece sorter or workpiece distributor, especially with the aid of an aligner/reader. The simultaneous transferring a whole stack of workpiece may improve the transfer throughput, especially for stations with high overhead such as a cassette loadlock.

Figure 3A:
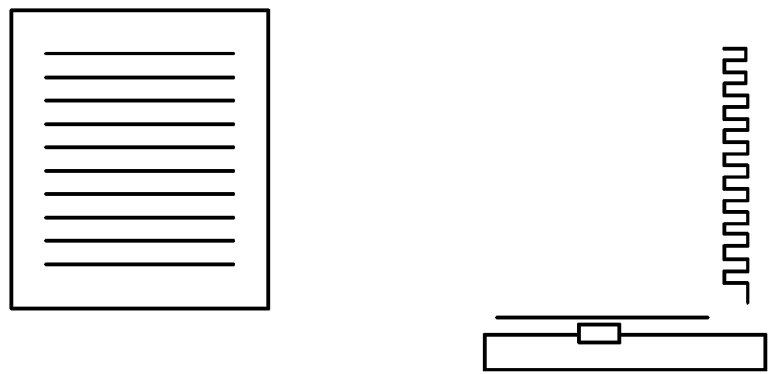
FIGS. 3A-3B show an exemplary retrieval sequence.
Figure 3B:
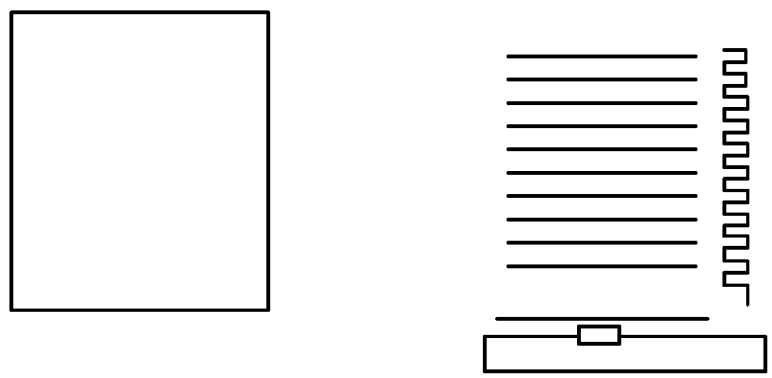
Figure 4A:
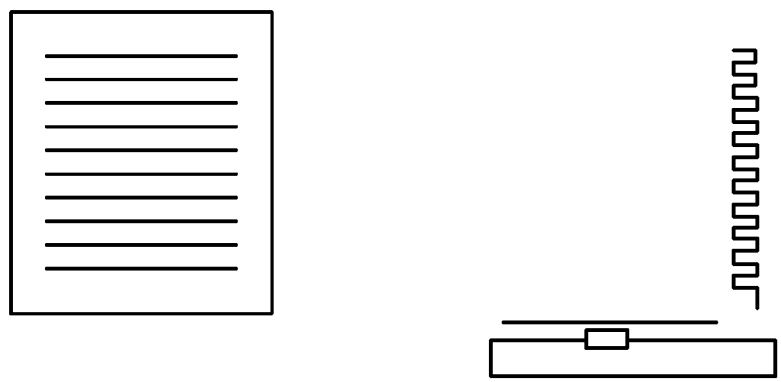
FIGS. 4A-4C show another exemplary retrieval sequence.
Figure 4B:
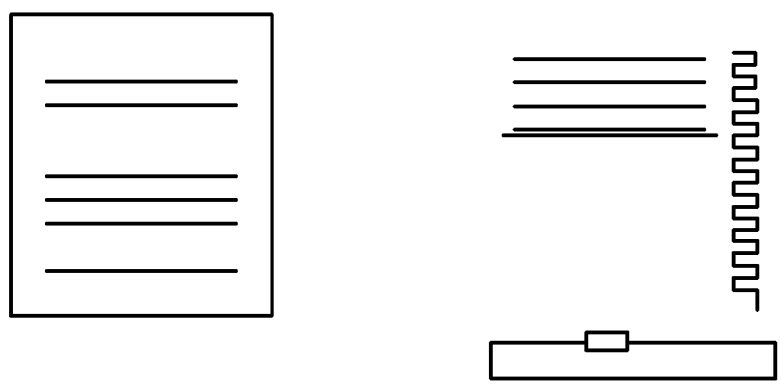
Figure 4C:
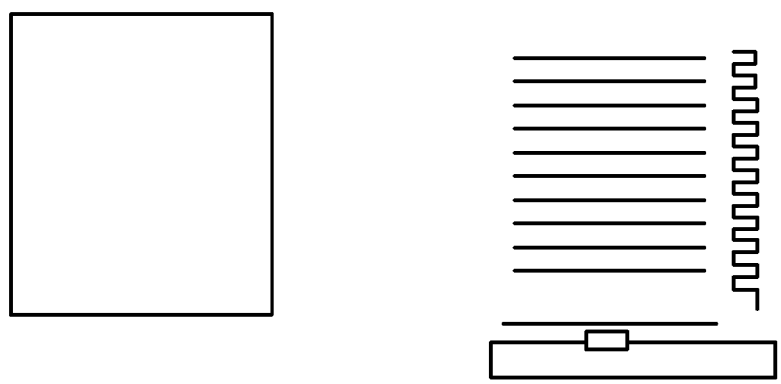
Figure 5A:
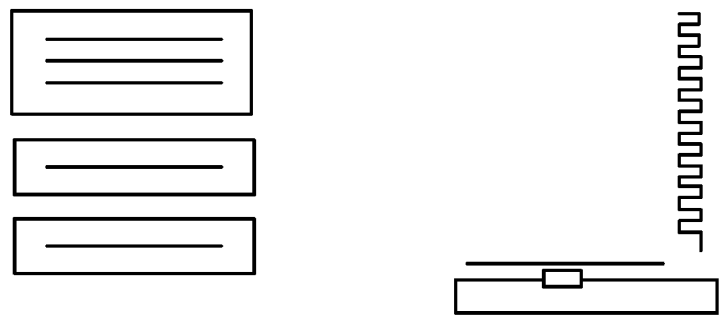
FIGS. 5A-5C show another exemplary retrieval sequence.
Figure 5B:
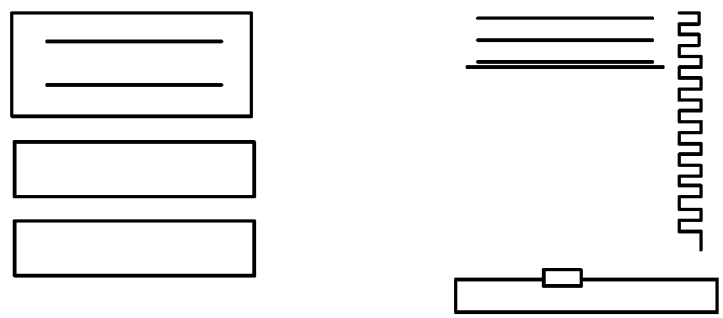
Figure 7A:
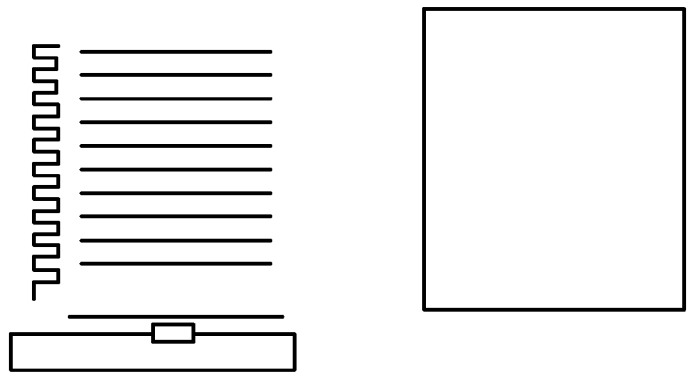
FIGS. 7A-7C show another exemplary placing sequence.
Figure 7B:
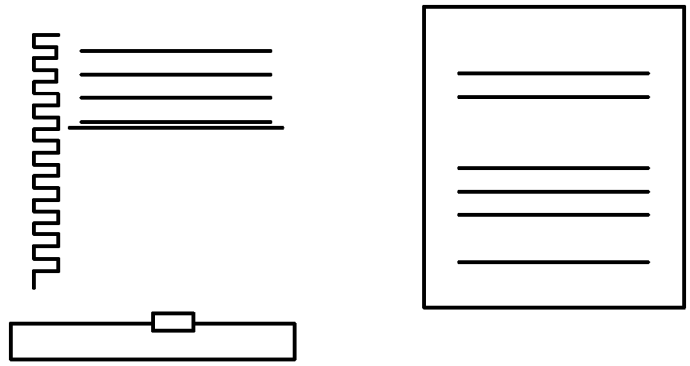
Figure 7C:
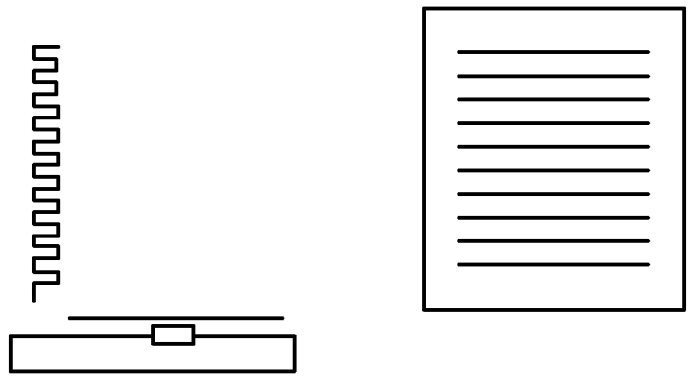
Figure 8A:
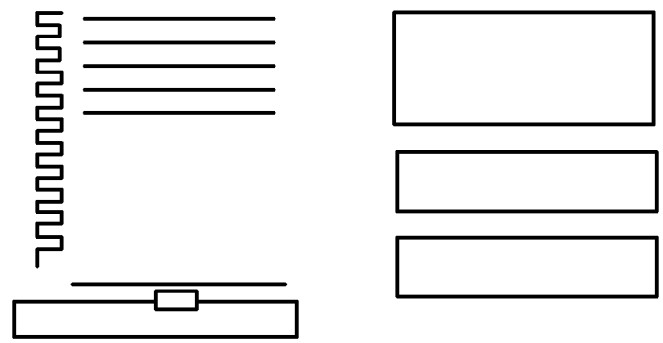
FIGS. 8A-8C show another exemplary placing sequence.
Figure 8B:
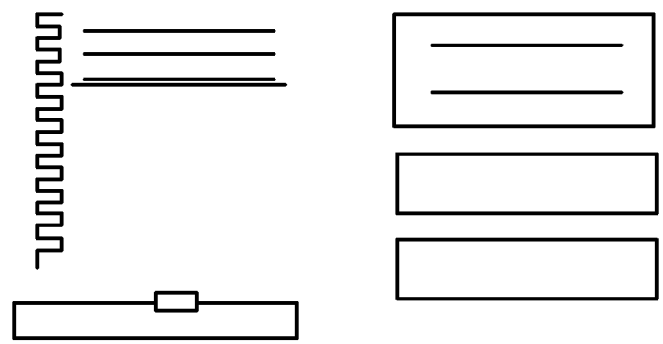
Figure 8C:
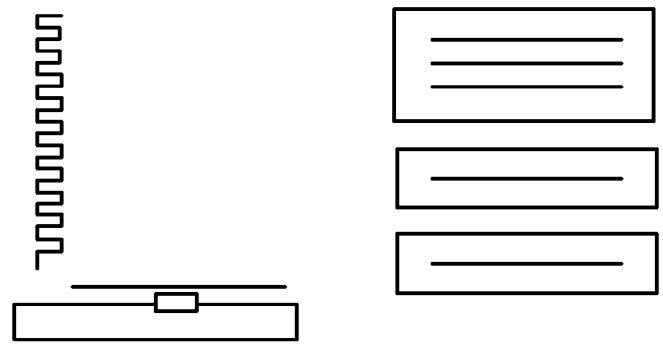

FIGS. 3-5 illustrate possible workpiece retrieval sequences from a plurality of supply stations, and FIGS. 6-8 illustrate possible workpiece placing sequences to a plurality of destination stations. FIG. 3 show an exemplary workpiece retrieval sequence from a supply station using the multiple end effector. FIG. 3A shows the robot arm facing the supply station. The supply station includes a plurality of workpieces to be transferred. The robot arm uses the multiple end effector to pick up the plurality of workpieces from the supply station, and retreat back to the original position or to proceed to a destination (FIG. 3B). Depending on the number of workpieces in the supply station, and number of slots in the multiple end effector, all or part of the workpieces within the supply station can be retrieved. The station can be designed to accommodate the multiple end effector, thus, for example, a 25 slot end effector can retrieve e.g., 5 workpieces from the station. FIG. 3 show the exemplary embodiment where all workpieces in the supply station are retrieved, but in other embodiments, only a portion of the workpieces can be picked up. The stack transferring of workpieces can quickly clear the workpieces within a supply station, thus can be potential beneficial for high overhead station. For example, supply station can be a loadlock, which requires significant time for venting and pumping before ready. The stack transferring can clear the loadlock quickly, thus allowing the venting and pumping of the loadlock while the workpieces can be continued processed from the temporary storage in the multiple end effector.

FIG. 4 show an exemplary workpiece retrieval sequence from a supply station using the single end effector as the retrieval means and the multiple end effector as a temporary storage. FIG. 4A shows the robot arm facing a supply station containing a plurality of workpieces. The single end effector can retrieve the workpieces from the supply station, singularly and randomly. Each workpiece from the supply station can be picked up randomly by the single end effector, and placed in the multiple end effector. As shown in FIG. 4B, four workpieces at random locations in the supply station are retrieved and placed in the multiple end effector. In this configuration, the single end effector approaches the multiple end effector from the bottom, thus the workpieces are sequentially stored from the top down in the multiple end effector. Other storage configurations of the multiple end effector are possible, depending on the designs. As shown, four workpieces have been retrieved, with the single end effector still handling the fourth workpiece in the multiple end effector. The workpiece retrieval can retrieve any arbitrary number of workpieces from the supply station. For example, the workpiece transfer can stop at FIG. 4B where only four workpieces are needed to be retrieved. The transfer can also retrieve all the workpieces from the supply station, as shown in FIG. 4C.

The optional aligner/reader located on the robot arm body can align, center and read the ID mark of the workpieces while the workpieces are being handled by the single end effector. For example, after the single end effector retrieves the workpiece to a resting position, an optional workpiece centering mechanism can center the workpiece. The single end effector then can center the workpiece by moving the workpiece back to the centering position after finding the wafer center through the rotating chuck.

Simultaneous wafer alignment can also be performed. At the end effector resting position, the rotation chuck is raised to free the wafer from the constraint of the end effector. Then the rotation chuck can rotate to align the wafer, to a notch, a flat or a wafer ID location, according to a notch, flat or ID finder mechanism. After the completion of the alignment, the rotation chuck is lowered, and the wafer resting on the end effector again. The wafer centering is typically performed before the wafer alignment for provide the centricity needed for stable rotation.

Simultaneous wafer identification can also be performed. A wafer identification assembly such as an OCR subsystem can read the wafer ID. The wafer identification subsystem can be positioned at a location where the wafer ID is known. The wafer identification subsystem can be dependent of the wafer alignment subsystem where the wafer is rotated to position the wafer under the wafer identification subsystem. The wafer identification subsystem can be independent of the wafer alignment subsystem where the wafer identification subsystem rotate to search for the wafer ID.

Figure 5C:
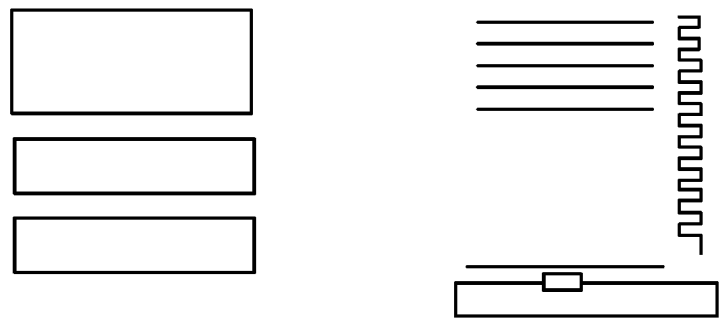

FIG. 5 show an exemplary workpiece retrieval sequence from a plurality of supply stations. FIG. 5A shows the robot arm facing the supply stations containing a plurality of workpieces. The single end effector can retrieve the workpieces from the supply stations, and placed in the multiple end effector. As shown in FIG. 3B, three workpieces in the supply stations are retrieved and placed in the multiple end effector. The transfer can also retrieve all the workpieces from the supply stations, as shown in FIG. 5C. The transferring by the single end effector can be accompanied by the alignment, centering and ID reading before storing in the multiple end effector.

Figure 6A:
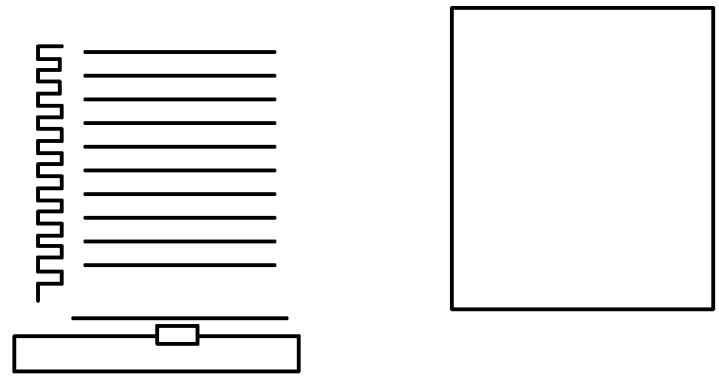
FIGS. 6A-6B show an exemplary placing sequence.
Figure 6B:
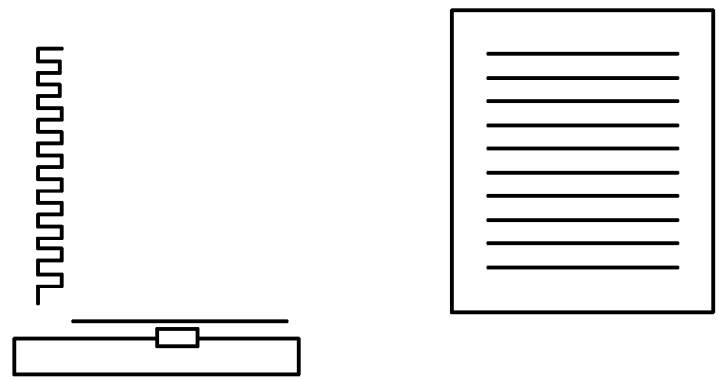

FIGS. 6-8 illustrate three workpiece placing sequences to a plurality of destination stations. FIGS. 6A and 6B show an exemplary workpiece placing sequence to a destination station using the multiple end effector. This operation can have a short access time of the station, thus allowing the station to perform other tasks, such as pumping or venting. FIGS. 7A, 7B and 7C; and 8A, 8B and 8C show other exemplary workpiece placing sequences using the multiple end effector as the temporary storage to a plurality of destination stations. The single end effector can sequentially transfer the workpieces from the multiple end effector to the destination stations. The placing operation can be random, thus even though the workpiece can be picked up from the bottom of the stack, it can be placed anywhere in the destination station, or in different destination station. This operation provides the capability of workpiece sorter, where the stack of workpieces can be sorted to any destination station. With the optional aligner/reader station built in the robot body, the single end effector can effective align, center and identify the workpiece for the workpiece sorter operation.

Figure 9A:
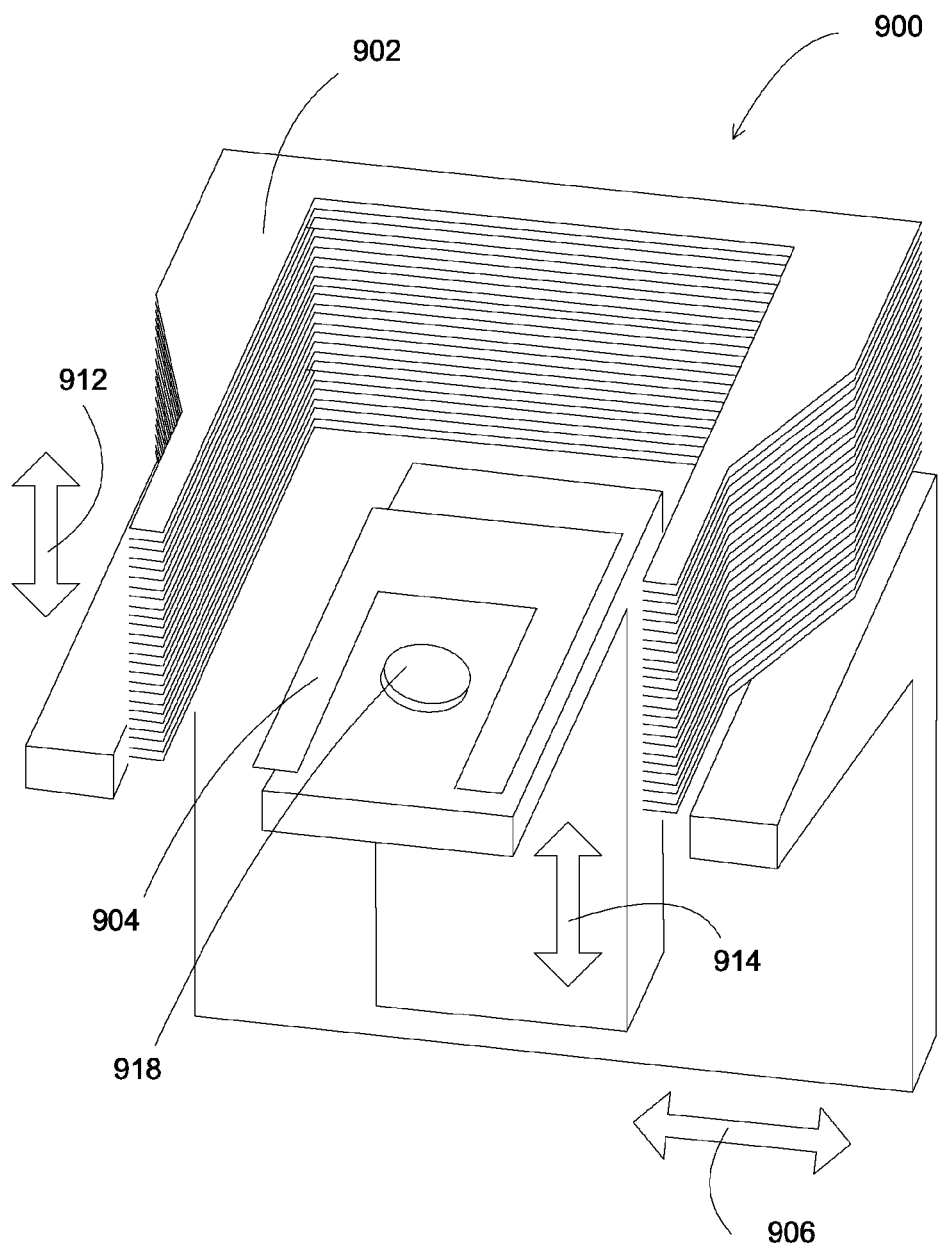
FIGS. 9A-9G show an exemplary transfer sequence with perspective view.
Figure 9B:
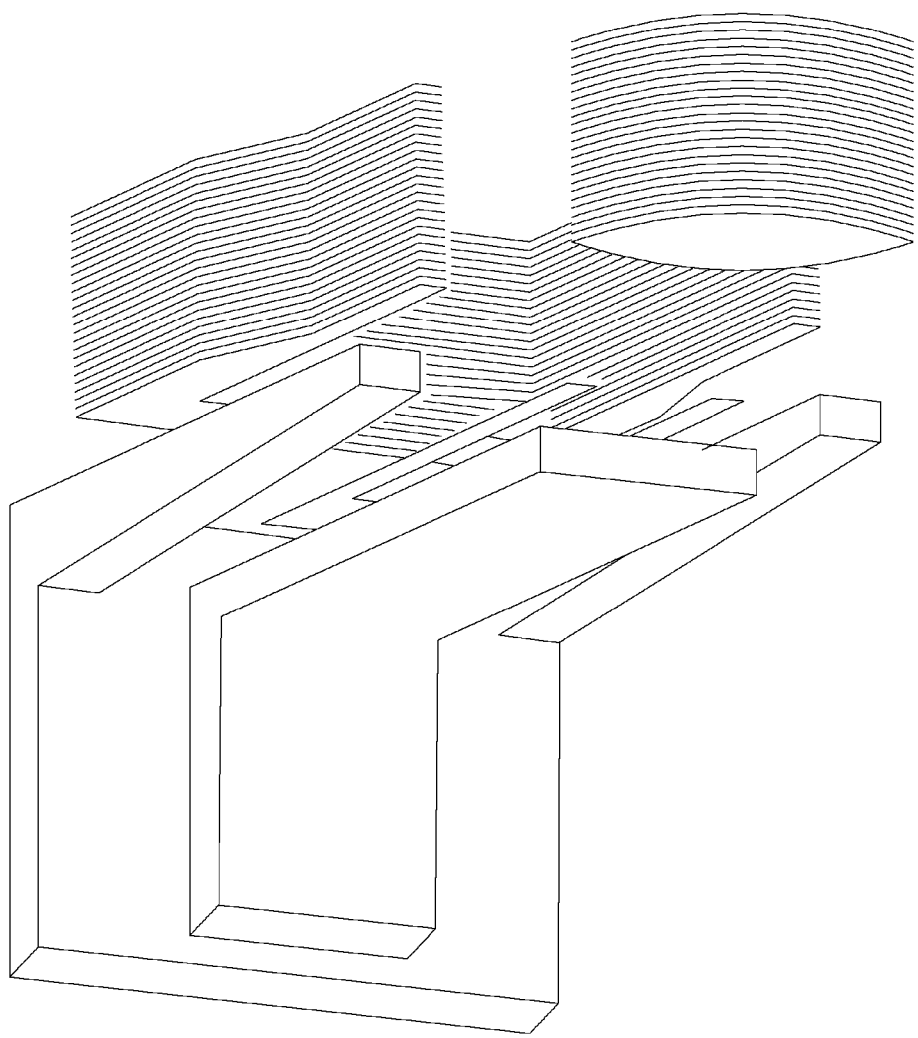
Figure 9C:
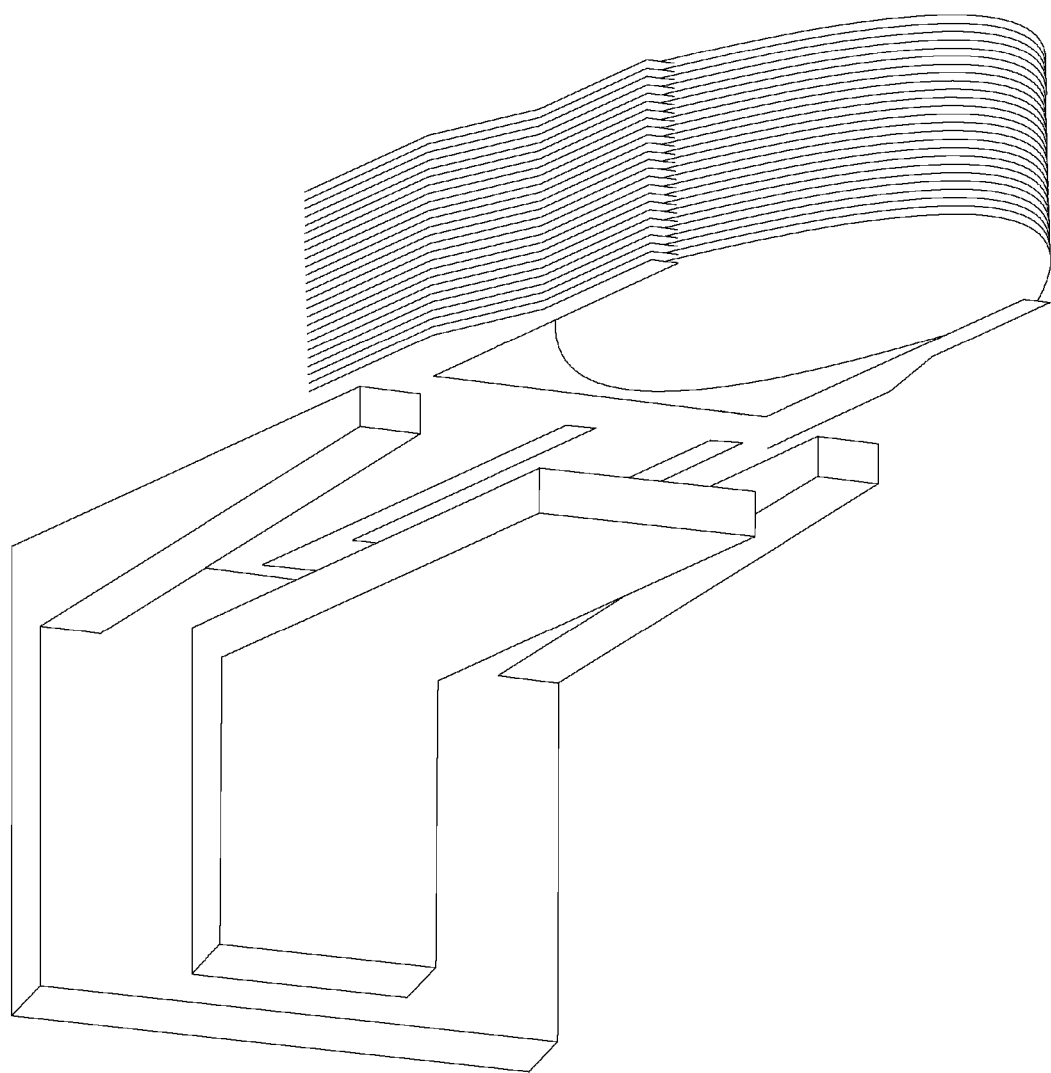
Figure 9D:
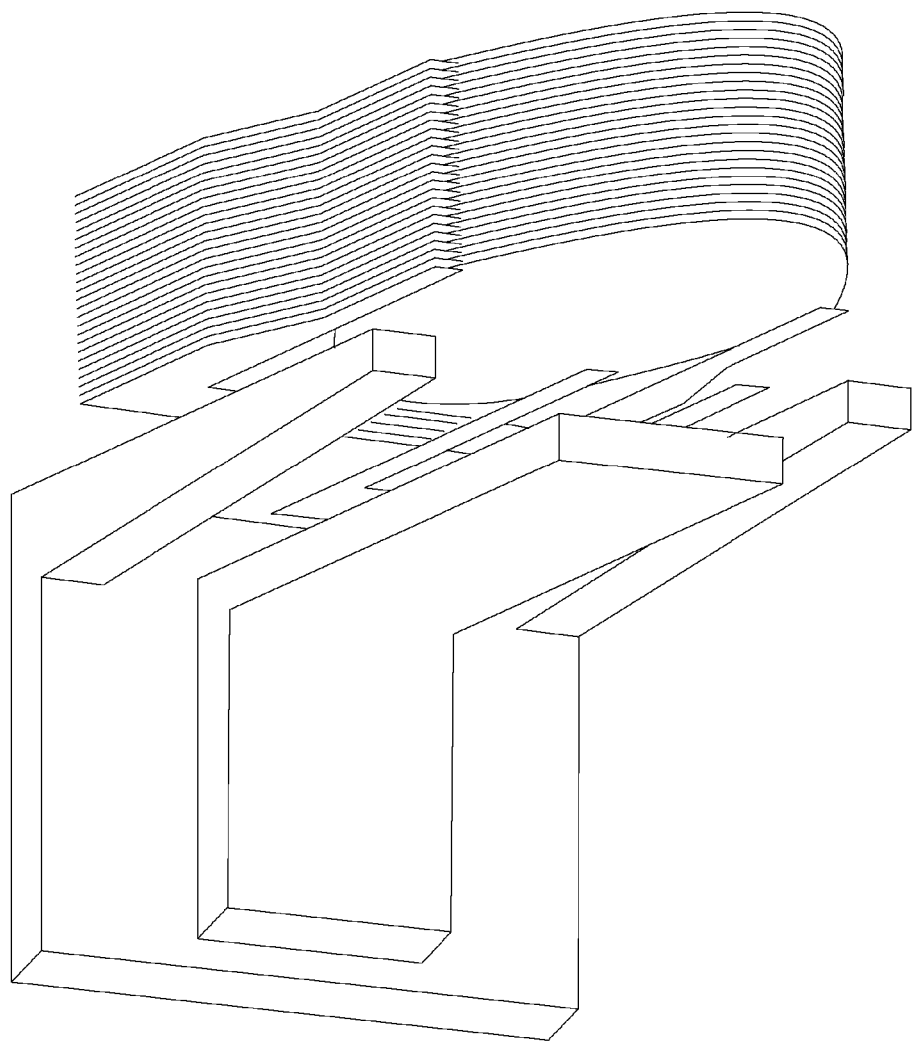
Figure 9E:
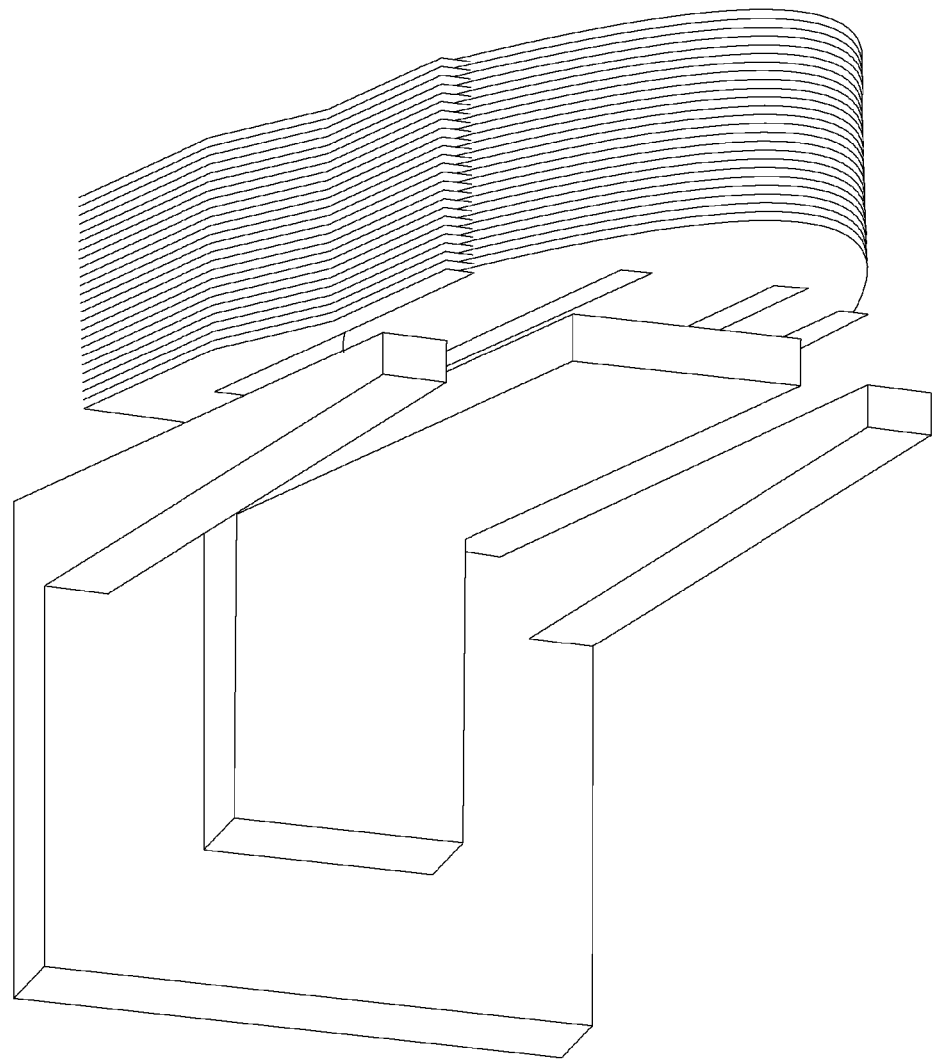
Figure 9F:
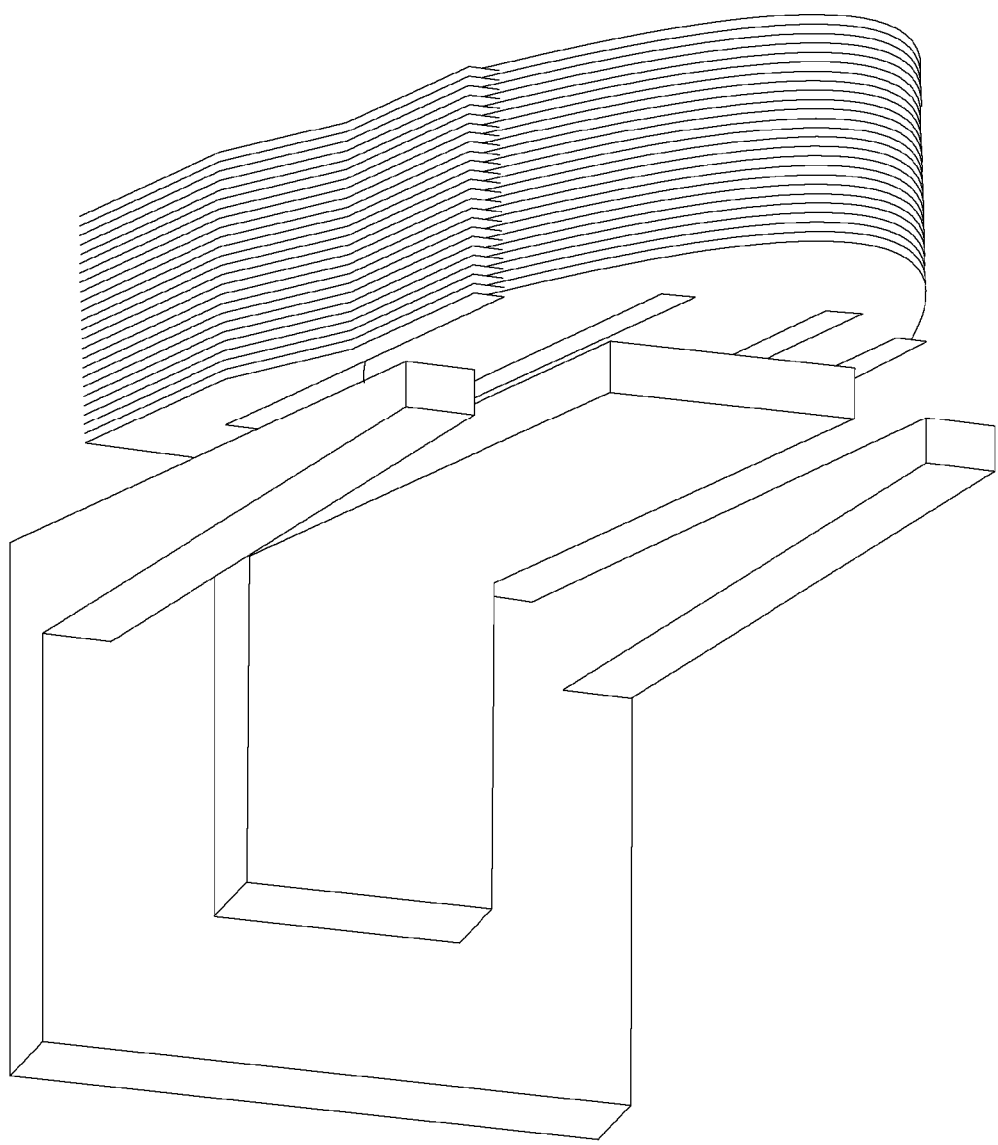
Figure 9G:
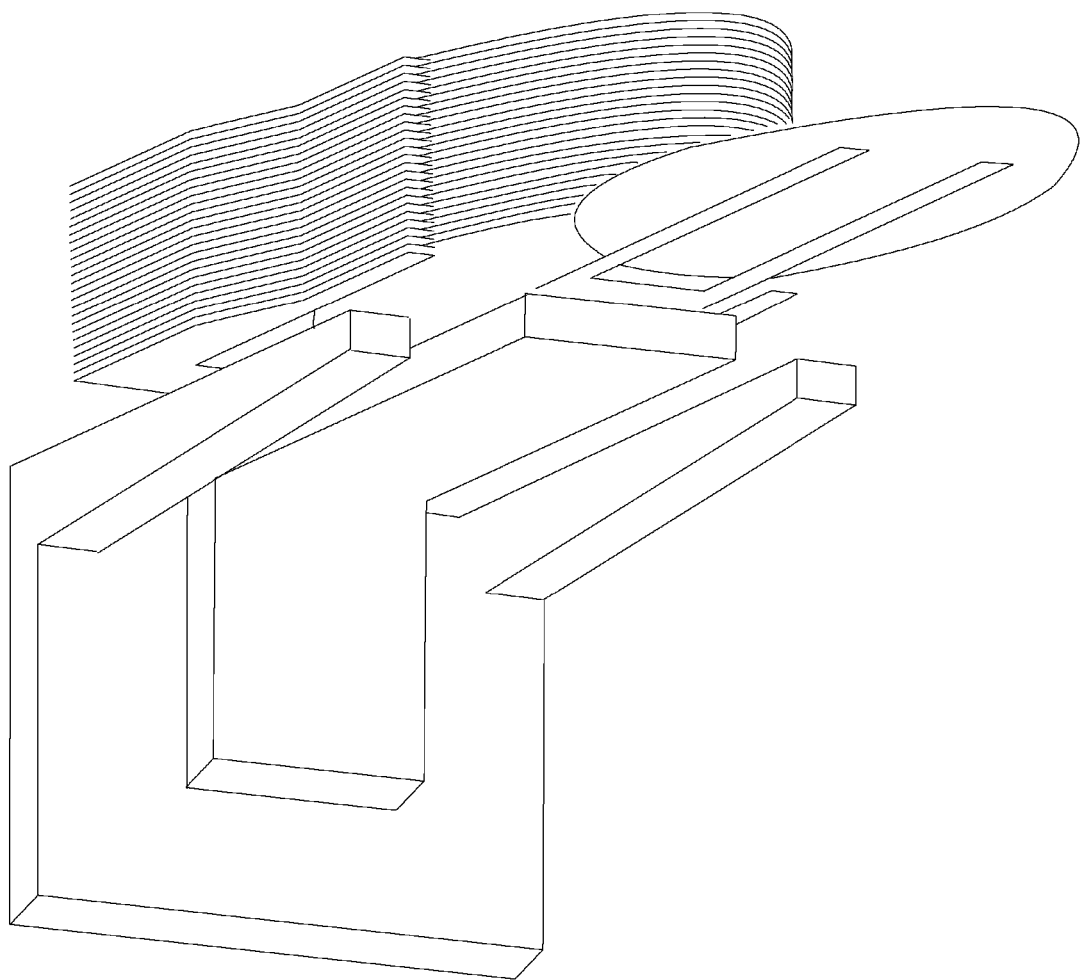

A complete workpiece transfer mechanism can comprise a workpiece retrieval sequence of FIGS. 3-5 and a workpiece placing sequence of FIGS. 6-8. Any combination is possible, depending on the needs and the available configurations.D1amd FIGS. 9A-9G illustrate an exemplary workpiece transfer sequence with 3D view. The robot arm configuration 900, comprising a 25 wafer robot 902 and a single wafer robot 904 with lift and rotary chuck 918, is shown in FIG. 9A, with at least a side movement 906 of the whole assembly, an up movement 912 of the multiple end effector, and an up movement 914 of the single end effector. Other movements include the extending and retracting of the multiple and single end effectors. FIG. 9B shows the robot arm moving to face a supply station, such as a FOUP 1. FIG. 9C shows the multiple end effector retrieving wafers from the FOUP 1, for example 25 wafers. FIG. 9D shows the robot arm moving to a destination station, such as FOUP 2. FIG. 9E shows the single end effector picking the lowest wafer from the multiple end effector. FIG. 9F shows an edge grip and wafer retract to transfer to the rotating chuck. The aligner/reader station can find the alignment mark, such as a notch or a flat, center the wafer, and perform ID OCR reading. After identifying the wafer, the rotating chuck dechuck, for example, releasing a vacuum suction, performing edge grip. The robot arm then moves to the appropriate slot. FIG. 9G shows the single end effector placing the aligned/center and identified wafer to the appropriate slot in the destination FOUP 2.

The robot assembly can comprise a plurality of articulate joint arms. In other embodiment, an exemplary robot can include the linear r movement, e.g. extending and retracting, to receive a workpiece, the rotation theta movement of the articulate arm, and the vertical z movement of raising or lowering the workpieces. A robot assembly for transferring a plurality of workpieces, comprises a multiple end effector 902 comprising a first support to support multiple workpieces 932; a first movement mechanism 934 configured to move the multiple end effector between a retracted position 926 and an extended position 936; a single end effector 904 comprising a second support to support a workpiece 972; a second movement mechanism 974 configured to move the single end effector between a retracted position 966 and an extended position 976; and a third movement mechanism 903 configured to move the single end effector between a down position 942 and a plurality of up positions 952. The robot assembly can also comprise a fourth movement mechanism 907 to move 940 the robot assembly to a workpiece station. The robots can include several different mechanisms to perform the movement of the workpieces, such as linear track, multi-segmented articulated arms, frog arms, swivel arms, scissors and telescopic mechanism, four-bar linkage mechanism. The robot arm can comprise an end effector to receive a workpiece, such as using gravitation force, or edge grip force. The robot's movements, such as a combination of linear and rotational motions, are typically designed to avoid high accelerations.

The transport mechanism for the robot assembly can include a plurality of robot arms which are driven independently of each other. Thus the robot arm has high degree of freedom in movement, and can be able to reach many places. The operations of the robot assembly can be controlled by a computer system.

A robot arm having the ability to handle a plurality of workpieces can increase the efficiency of robot handling. The robot assembly can be constructed with motors such as servo motors with a synchronous device. The robot assembly can comprise 4 arm segments and multiple degrees of freedom at each joint. The robot arm can move virtually in all directions with no constraints of r, theta and z as in linear arms. The robot can have only one motor control for the first arm, with the second arm depending on the movement of the first arm. The robot can also have two motor controls, one for rotating the first arm, and one for rotating the second arm. The second arm in this case can move independent of the first am.

In an exemplary embodiment, the transfer robotic system can comprise a plurality of integrated robot assemblies, each with its own, or shared, end effectors, wafer centering subsystem, wafer alignment subsystem 11 such a rotation chuck and/or wafer identification subsystem 11 such as an OCR. In another exemplary embodiment, the transfer robotic system is employed in a transfer system, such as a FIM (front interface mechanism), or a FEM/EFEM (front end module or equipment front end module). The chambers can be arranged in a circular ring around the integrated robot system, arranged linearly at one side of the integrated robot system, or arranged linearly at both side of the integrated robot system.

The present invention robot assembly can be used in a sorter or stocker equipment, such as a wafer sorter or stocker, a LCD sorter or stocker, or a reticle sorter or stocker. It can also be used in processing equipment such as deposition, etching, track, lithography exposure, developer, and bake. It can also be used in transport workpieces from a loadlock to a buffer, or to a process chamber, to a storage chamber, or to a sorter chamber. It can also be used in Front End loader, to transfer workpieces from FOUPs to loadlocks.

An embodiment of the stocker according to the present invention comprises a stocker storage area having the workpieces arranged in an array. The transfer robot can be installed at a front side of the stocker array for transfer the workpieces in and out of the stocker. The stocker station can interface with the tracks in the interbay multilevel track system. Another robot assembly moves the carriers between the stocker and interbay track system. When the transfer or handling capability is insufficient with only a transfer robot, the storage of the lots in the stocker can be performed by using a second transfer robot.

The robot assembly can be used, in one embodiment, in the front end assembly to transfer workpieces between cassettes in a pod assembly. The front end assembly generally contains a horizontal motion robot assembly to move a workpiece to the front end module or to the central module.

The robot assembly further comprises a plurality of sensors, such as workpiece positioning sensors, image sensing of position errors, RF electric field sensing, magnetic resonance sensing, laser scanning, sensing with photo detector arrays, motor operation sensing, arm position sensing, or any sensors related to the operation and service. Furthermore, the sensors provides the status and locations of the robot assembly, thus allowing the optimum utilization of the remaining operative part of the assembly, plus the alerting the operator for servicing the inoperative parts of the assembly.

What is claimed is:

1. A robot assembly for transferring a plurality of workpieces, comprising:
    a body;
    a multiple end effector comprising a first support to support multiple workpieces;
    wherein the multiple end effector is coupled to a first portion of the body and configured for moving between a first retracted position and a first extended position with respect to the first portion of the body;
    a single end effector comprising a second support to support a workpiece, wherein the first support and the second support support the workpieces in non-overlapping positions to allow the single end effector to access a workpiece supported by the first support;
    wherein the single end effector is coupled to a second portion of the body and configured for moving between a second retracted position and a second extended position with respect to the second portion of the body;
    wherein the second portion is coupled to the first portion and configured for moving between a down position and a plurality of up positions relative to the first portion;
    wherein the multiple end effector and the single end effector are coupled to the body to move as a unit when the body moves to face one or more workpiece stations,
    wherein the multiple end effector and the single end effector are configured so that the second portion moves between the up and down positions relative to the first portion without obstruction when the multiple end effector is in the first retracted position,
    wherein the first or the second extended position can reach into a workpiece station,
    wherein the up positions place the second support into the first support for the single end effector to access a workpiece supported by the first support, and
    wherein the down position places the single end effector away from the multiple end effector so that the multiple end effector moves between the first retracted position and the first extended position without obstruction.

2. A robot assembly as in claim 1 further comprising a rotating chuck disposed on the second portion for rotating workpiece in the vicinity of the down position.

3. A robot assembly as in claim 2 further comprising an aligning/reading mechanism disposed on the robot assembly for reading an identification mark of a workpiece on the rotating chuck.

4. A robot assembly as in claim 1 wherein the first support supports multiple workpieces from the side edges and the second support supports a workpiece from the bottom.

5. A robot assembly as in claim 1 wherein the second portion when moving from the down position to the up position moves the single end effector linearly to access the multiple workpieces of the multiple end effector sequentially from the bottom up.

6. A robot assembly as in claim 1 wherein the single end effector can transfer a workpiece between the multiple end effector and a workpiece station.

7. A robot assembly for transferring a plurality of workpieces, comprising:
    a body;
    a first support for supporting multiple workpieces, the first support coupled to a first portion of the body and configured for accepting a plurality of workpieces from a first workpiece station; and
    a second support for supporting a workpiece, the second support coupled to second portion of the body and configured for transferring a workpiece between the first support and a second workpiece station;
    wherein the first portion and the second portion are coupled to the body to move as a unit when the body moves to face the first or second workpiece station.

8. A robot assembly as in claim 7 wherein the second support is configured to accept a workpiece from the first support and is configured to transfer the workpiece from the second support to the second workpiece station.

9. A robot assembly as in claim 7 further comprising an alignment mechanism coupled to the second portion of the body and configured to align the workpiece during the transfer between the first support and the second workpiece station.

10. A robot assembly as in claim 7 further comprising an aligning/reading mechanism coupled to the second portion of the body and configured to identify the workpiece during the transfer between the first support and the second workpiece station.

11. A robot assembly as in claim 7 wherein the first support is configured for transferring multiple workpieces from or to a workpiece station and the second support is configured to retrieve a workpiece in the first support and move to an aligner for aligning the retrieved workpieces according to a predetermined alignment mark.

12. A method for transferring a plurality of workpieces between a plurality of workpiece stations through a robot assembly comprising a multiple end effector and a single end effector coupled to a body to move as a unit for facing the plurality of workpiece stations, the method comprising:
    transferring simultaneously multiple workpieces of the plurality of workpieces between the robot assembly and a workpiece station of the plurality of workpiece stations by the multiple end effector; and
    transferring each workpiece of the multiple workpieces sequentially between the multiple end effector and one or more workpiece stations of the plurality of workpiece stations by the single end effector.

13. A method as in claim 12 wherein transferring each workpiece of the multiple workpieces further comprises aligning the workpiece to an alignment mark.

14. A method as in claim 12 wherein transferring each workpiece further comprises identifying the workpiece by reading an ID mark.

15. A method as in claim 12 wherein transferring multiple workpieces comprises retrieving the multiple workpieces from a workpiece station or placing the multiple workpieces to a workpiece station.

16. A method as in claim 12 wherein transferring each workpiece comprises retrieving the each workpiece from the multiple workpieces within the robot assembly and placing the each workpiece to a workpiece station.

17. A method as in claim 12 wherein transferring each workpiece comprises retrieving the each workpiece from a workpiece station and adding the each workpiece to the multiple workpieces within the robot assembly.

18. A method as in claim 12 wherein transferring each workpiece of the multiple workpieces comprises sorting the workpieces from the multiple workpieces.

* * * * *